(12) United States Patent
Morishita

(10) Patent No.: US 6,483,365 B2
(45) Date of Patent: Nov. 19, 2002

(54) SEMICONDUCTOR DEVICE

(75) Inventor: Yasuyuki Morishita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/100,846

(22) Filed: Mar. 19, 2002

(65) Prior Publication Data

US 2002/0105368 A1 Aug. 8, 2002

Related U.S. Application Data

(62) Division of application No. 09/919,117, filed on Jul. 31, 2001.

(30) Foreign Application Priority Data

Aug. 2, 2000 (JP) .......................................... 2000-234737

(51) Int. Cl.[7] .............................. H03K 5/08; H03L 5/00
(52) U.S. Cl. ........................ 327/314; 327/319; 327/320; 361/91.5
(58) Field of Search ................................. 327/309, 310, 327/314, 318, 319, 320, 321, 324, 327, 328; 361/56, 91.5, 91.6, 91.7, 93.1

(56) References Cited

U.S. PATENT DOCUMENTS 5,864,254 A * 1/1999 Tashiro ........................ 327/314
6,275,089 B1 * 8/2001 Song et al. .................. 327/314

* cited by examiner

*Primary Examiner*—Tuan T. Lam
(74) *Attorney, Agent, or Firm*—Hayes Soloway PC

(57) ABSTRACT

A semiconductor device is provided with a signal terminal, a high potential side power supply terminal, a low potential side power supply terminal, a first wiring connected to the high potential side power supply terminal, a second wiring connected to the low potential side power supply terminal, and an internal circuit to which power is supplied from the first and second wirings. Further the semiconductor device is provided with a first and a second resistance elements whose one end is connected to a first node, a first protection element having a first terminal connected to the first wiring and a second terminal connected to the other end of the first resistance element, a second protection element having a third terminal connected to the other end of the second resistance element and a fourth terminal connected to the second wiring, and a third protection element having a fifth terminal connected to the first wiring and a sixth terminal connected to the second wiring.

10 Claims, 7 Drawing Sheets

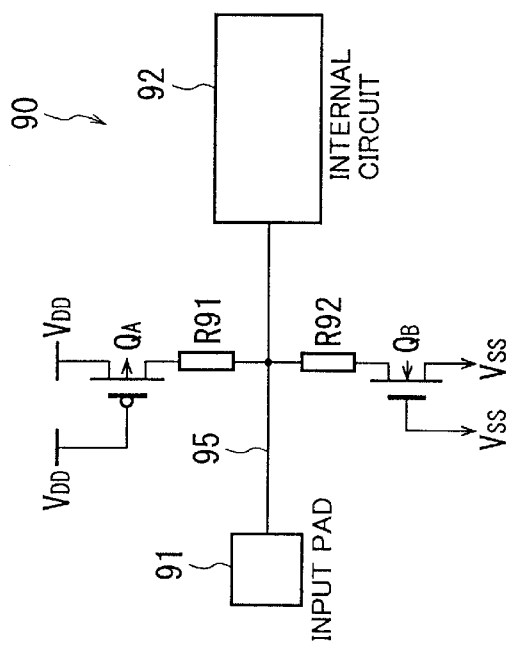
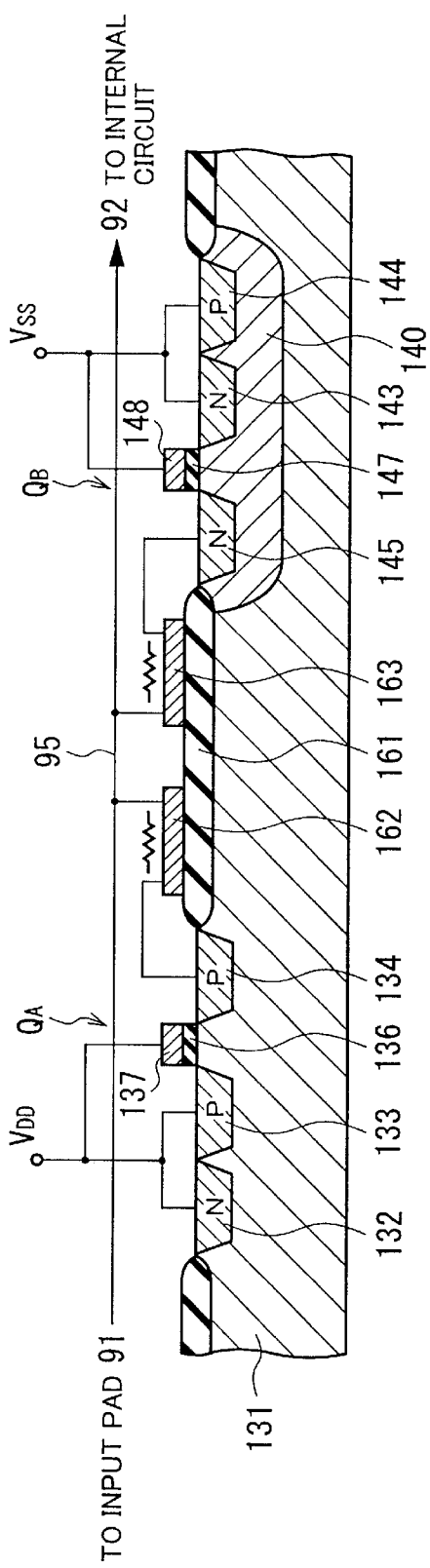
FIG. 3A (PRIOR ART)
FIG. 3B (PRIOR ART)

US 6,483,365 B2

1

SEMICONDUCTOR DEVICE

This application is a divisional of co-pending application Ser. No. 09/919,117, filed Jul. 31, 2001.

BACKGROUND OF THE INVENTION

1. Field of the Invention

The present invention relates to semiconductor device provided with an electrostatic discharge (ESD) protection circuit for protecting internal elements of the semiconductor device from destruction caused by electrostatic current and the like.

2. Description of the Related Art

Conventionally, various kinds of methods are proposed to protect semiconductor device from destruction caused by the electrostatic current and the like. However, as for protection of a signal terminal for inputting/outputting a high-speed signal or a high-frequency signal, in many cases, a relation between increase of terminal capacitance by a protection circuit or a protection element and protection performance thereof becomes a relation of "trade-off". For that reason, compatibility of control of increase of capacity and improvement of protection performance is difficult.

For instance, the official gazette of the Japanese Patent No. 2,715,593 discloses a semiconductor integrated circuit in which protection performance is improved while controlling increase of terminal capacitance of a terminal to be protected (a first prior art). FIG. 1A is a circuit diagram illustrating a constitution of a semiconductor integrated circuit according to the first prior art.

In the semiconductor integrated circuit 70 according to the first prior art, a first diode 71 is connected to a high potential side power supply terminal $V_{CC}$ and an I/O terminal IN/OUT therebetween. A second diode 72 is connected to the I/O terminal IN/OUT and a low potential side power supply terminal $V_{EE}$ therebetween. A third diode 73 is connected to the high potential side power supply terminal $V_{CC}$ and the low potential side power supply terminal $V_{EE}$ therebetween. An internal circuitry 77 is connected to the I/O terminal IN/OUT. Electricity from the high potential side power supply terminal $V_{CC}$ and electricity from the low potential side power supply terminal $V_{EE}$ are supplied to the internal circuitry 77. The respective diodes are constituted so that backward bias is applied to the respective diodes at the time the circuit is operated, and the respective diodes possess function of avalanche breakdown voltage more than voltage value that is capable of being applied. Consequently, each diode functions as an additional capacitance at the time that the circuit is operated.

FIG. 1B is a circuit diagram illustrating operations of the semiconductor integrated circuit according to the first prior art.

For instance, as illustrated in FIG. 1B in, there are three kinds of current paths when electrostatic discharge occurs from the high potential side power supply terminal $V_{CC}$ to the I/O terminal IN/OUT. A first path A is one in which discharge occurs through the diode 71. A second path B is one in which discharge occurs through the internal circuitry 77. A third path C is one in which discharge occurs through the diode 72 and the diode 73. Accordingly, the avalanche breakdown voltage of the diode 73 is at the most of the same degree of that of the diodes 71 and 72, and if impedance of the diode 73 is low, surge by ESD is distributed into approximately half-and-half onto the path A and the path C. For that reason, even though sizes of the diode 71 and the

2 diode 72 are halved, resist quantity of electrostatic surge can be ensured. Consequently, capacitive load of I/O terminal is reduced.

"ESD Protection Using a variable voltage supply Clamp" (written by Gregg D. Croft (EOS/ESD Symposium Proceedings pp 135–140, 1994)) discloses an integrated circuit (a second prior art) provided with a clamp device (Supply Clamp) between a positive power supply (V+) terminal and a negative power supply (V−) terminal.

According to the second prior art, even though the surge by ESD is applied to the I/O terminal, a protection diode of the I/O terminal does not cause an avalanche breakdown. Consequently, the protection diode is miniaturized with ESD event resist quantity ensured.

FIG. 2 is a block diagram illustrating a constitution of an ESD protection circuit of the integrated circuit (IC) 80 according to the second prior art.

Protection diodes D1 and D3 are connected to the I/O terminals 82, 83 of IC 80 and the V1+ terminal therebetween, in which respective anodes of the diodes D1 and D3 are directed to the I/O terminal side. Protection diodes D2 and D4 are connected to the I/O terminals 82, 83 and the V1− terminal therebetween, in which respective cathodes of the diodes D2 and D4 are directed to the I/O terminal side. A clamp device 85, which is made up of a thyristor, is provided between the V1+ terminal and V1− terminal.

The protection diodes D1 to D4 are capable of being discharged without causing avalanche breakdown even though the surge by ESD is applied to the I/O terminals 82, 83 in such a way that clamp voltage of the clamp device 85 is maintained to be minimized less than a value that is obtained by subtracting voltage value corresponding to voltage drop of two forward bias diodes from the avalanche breakdown voltage of the protection diodes D1 to D4.

Concretely, for instance, in cases where positive surge pulse by ESD is applied to the I/O terminal 82 against the V1− terminal, current flows from the protection diode D1 (forward direction) toward the V1+ terminal, the current flows from the V1+ terminal toward the clamp device 85, and the current flows from the clamp device 85 toward the V1− terminal. Thus, the surge by ESD is discharged. Current does not flow toward the protection diode D2. Since the protection diode D1 is operated in the forward direction, power consumption is small. Consequently, also since heat generation is small, it is possible to sufficiently miniaturize the protection diode D1. As to the other diodes D2 to D4, similarly, it is possible to miniaturize size thereof.

In actual state of use where all is mounted on the printed circuit board, the V1+ terminal and the V2+ terminal are short-circuited, and the V1− terminal and the V2− terminal are short-circuited. consequently, an anode of the thyristor and an anode gate thereof are short circuited, further, a cathode of the thyristor and a cathode gate thereof are short-circuited. Namely, under the actual state of use, sufficient high clamp voltage is maintained, latch up operation does not occur within a range of a general operating voltage of IC.

The Official gazette of the Japanese Patent Application Laid-Open No, Hei 6-69429 discloses a semiconductor circuit (a third prior art) provided with a protection device for protecting destruction of a gate oxide film of a MOS transistor (transistor for internal circuit protection) caused by static electricity and the like. FIG. 3A is a circuit diagram illustrating a protection circuit of a semiconductor circuit according to the third prior art, and FIG. 3B is a cross sectional view illustrating a region corresponding to the protection circuit.

An input pad 91 of a semiconductor circuit 90 is connected to an internal circuit 92 via a signal line 95. A first resistor R91 is connected between the signal line 95 and a drain of a p-channel MOs transistor $Q_A$. A second resistor R92 is connected between the signal line 95 and a drain of an n-channel MOS transistor $Q_B$. A source of the transistor $Q_A$ and a gate thereof are connected to a power supply voltage $V_{PP}$ terminal. A source of the transistor $Q_B$ and a gate thereof are connected to a power supply voltage $V_{SS}$ terminal. An element separation oxide film 161 is formed between the transistors $Q_A$ and $Q_B$. Polysilicon made resistors 162 and 163 are formed on the element separation oxide film 161. The first resistor R91 corresponds to the resistor 162. The second resistor R92 corresponds to the resistor 163. One end of the resistor 162 is connected to a p-type diffused region 134. One end of the resistor 163 is connected to an n-type diffused region 145. The resistor 162 and the resistor 163 are connected to the signal line 95 respectively.

In the semiconductor circuit 90, an excessive voltage is applied to the respective drains of the transistors $Q_A$ and $Q_B$ through the resistor R91 (162) and the resistor R92 (163). For that reason, the excessive voltage is not applied directly to the gate oxide films 136 and 147. Consequently, resist noise characteristics of the gate oxide films 136 and 147 are improved. Accordingly, rate of flowing of leak current remarkably reduced.

In the first prior art, the protection diodes 71, 72 are provided between the I/O terminal and the power supply terminals. Large type protection diode 73 is provided between the power supply terminals. The protection diode 73 possesses approximately equivalent avalanche breakdown voltage to that of the protection diodes 71, 72. According to this constitution, current generated by the surge by ESD applied to the I/O terminal is separated, thus the protection diodes 71, 72 are miniaturized while maintaining ESD protection performance. However, it is necessary to ensure current flow in connection with its reverse direction current in some degrees toward the protection diodes 71, 72 to control stress for the internal circuit 77. Consequently, miniaturization of the protection diodes 71, 72 has a limitation to prevent destruction of the protection diodes 71, 72, with the result that parasitic capacitance more than $4_pF$ parasitizes the I/O terminal. Moreover, in order to miniaturize the protection diodes 71, 72 while sufficiently minimizing the reverse direction current A flowing through the protection diodes 71, 72, it is necessary to increase the avalanche breakdown voltage of the protection diodes 71, 72 in some degrees than that of the protection diode 73. In such a case, this causes stress increase for the internal circuit 77.

In the second prior art, the clamp device 85 made up of the thyristor is provided between the power supply terminals. Due to such constitution, miniaturization of the protection diodes D1 to D4 is made possible while maintaining ESD protection performance. However, when the thyristor is provided between the power supply terminals, there is the problem that operation can not be returned to normal operation until power supply is broken as the thyristor is turned ON caused by noise or the like.

In the third prior art, the MOS transistor is used for the protection device for protecting the internal circuitry. Further, resistive element is used for the protection device for preventing destruction of the gate oxide film of the protection transistor. However, measure for the protecting transistor is only taken when the excessive input is applied to an input terminal under the condition that the $V_{DD}$ terminal and the $V_{SS}$ terminal are normally connected, there is no consideration against to increase of input terminal capacitance caused by the protection device and static electricity before mounting.

SUMMARY OF THE INVENTION

An object of the present invention is to provide semiconductor device having an ESD protection circuit in which it is possible to control increase of additional capacitance of a signal terminal while being provided with predetermined protection performance against to surge by ESD and the like irrespective of before and after mounting, and further, it is possible to return to normal operation without breaking power supply after stresses such as surge by ESD and the like are removed.

According to a first aspect of the present invention, a semiconductor device comprises: a signal terminal; a high potential side power supply terminal; a low potential side power supply terminal; a first wiring connected to the high potential side power supply terminal; a second wiring connected to the low potential side power supply terminal; an internal circuit to which power is supplied from the first and the second wirings; first and second resistance elements whose each one end is connected to a first node, the first node being at a wiring connecting the signal terminal with the internal circuit; a first protection element having a first terminal connected to the first wiring and a second terminal connected to the other end of the first resistance element, voltage-current characteristics of the first protection element when the second terminal is grounded having a negative resistance region and a holding region; a second protection element having a third terminal connected to the other end of the second resistance element and a fourth terminal connected to the second wiring, voltage-current characteristics of the second protection element when the fourth terminal is grounded having a negative resistance region and a holding region; and a third protection element having a fifth terminal connected to the first wiring and a sixth terminal connected to the second wiring, the third protection element being made up of a MOS transistor, voltage-current characteristics of the third protection element when the sixth terminal is grounded having a negative resistance region and a holding region. The relations of "vh2(I1)+r2×I1≧Vf1+ Vr3>Vr2" and "Id2>I1" are satisfied, where I1 represents a value of a first current flowing from the signal terminal to the low potential side power supply terminal via the second resistance element, the second protection element and the second wiring, Id2 represents a value of the first current when it causes destruction of the second protection element, r2 represents a resistance value of the second resistance element, Vf1 represents a voltage when a current starts to flow through the first protection element in case that a positive voltage is applied to the second terminal while grounding the first terminal, Vh2(I1) represents a voltage drop of the second protection element caused by the first current I1, Vr2 represents a negative resistance starting voltage in the negative resistance region of the second protection element, and Vr3 represents a negative resistance starting voltage in the negative resistance region of the third protection element.

According to a second aspect of the present invention, a semiconductor device comprises: a signal terminal; a high potential Side power supply terminal; a low potential side power supply terminal; a first wiring connected to the high potential side power supply terminal; a second wiring connected to the low potential side power supply terminal; an internal circuit to which power is supplied from the first and the second wirings; first and second resistance elements whose each one end is connected to a first node, the first node being at a wiring connecting the signal terminal with the internal circuit; a first protection element having a first terminal connected to the first wiring and a second terminal connected to the other end of the first resistance element, voltage-current characteristics of the first protection element when the second terminal is grounded having a negative resistance region and a holding region; a second protection element having a third terminal connected to the other end of the second resistance element and a fourth terminal connected to the second wiring, voltage-current characteristics of the second protection element when the fourth terminal is grounded having a negative resistance region and a holding region; and a third protection element having a fifth terminal connected to the first wiring and a sixth terminal connected to the second wiring, the third protection element being made up of a MOS transistor, voltage-current characteristics of the third protection element when the sixth terminal is grounded having a negative resistance region and a holding region. The relations of "$Vh1(I2)+r1\times I2 \geq Vf2+Vr3>Vr1$" and "$Id1>I2$" are satisfied, where I2 represents a value of a second current flowing from the high potential side power supply terminal to the signal terminal via the first wiring, the first protection element and the first resistance element, Id1 represents a value of the second current when it causes destruction of the first protection element, r1 represents a resistance value of the first resistance element, Vf2 represents a voltage when a current starts to flow through the second protection element in case that a positive voltage is applied to the fourth terminal while grounding the third terminal, Vh1(I2) represents a voltage drop of the first protection element caused by the second current I2, Vr1 represents a negative resistance starting voltage in the negative resistance region of the first protection element, and Vr3 represents negative resistance starting voltage in the negative resistance region of the third protection element.

According to a third aspect of the present invention, a semiconductor device comprises: a signal terminal; a high potential side power supply terminal; a low potential side power supply terminal; a first wiring connected to the high potential side power supply terminal; a second wiring connected to the low potential side power supply terminal; an internal circuit to which power is supplied from the first and the second wirings; first and second resistance elements whose each one end is connected to a first node, the first node being at a wiring connecting the signal terminal with the internal circuit; a first protection element having a first terminal connected to the first wiring and a second terminal connected to the other end of the first resistance element, voltage-current characteristics of the first protection element when the second terminal is grounded having a negative resistance region and a holding region; a second protection element having a third terminal connected to the other end of the second resistance element and a fourth terminal connected to the second wiring, voltage-current characteristics of the second protection element when the fourth terminal is grounded having a negative resistance region and a holding region; a third protection element hating a fifth terminal connected to the first wiring and a sixth terminal connected to the second wiring, the third protection element being made up of a MOS transistor, and voltage-current characteristics of the third protection element when the sixth terminal is grounded having a negative resistance region and a holding region; and a fourth protection element made up of a diode whose anode is connected to a second node and whose cathode is connected to the first wiring, the second node being at the wiring connecting the signal terminal with the internal circuit. The relations of "$Vh2(I1)+r2\times I1 \geq Vf4+Vr3>Vr2$" and "$Id2>I1$" are satisfied, where I1 represents a value of a first current flowing from the signal terminal to the low potential side power supply terminal via the second resistance element, the second protection element and the second wiring, Id2 represents a value of the first current when it causes destruction of the second protection element, r2 represents a resistance value of the second resistance element, Vf4 represents a voltage when a current starts to flow through the fourth protection element in case that a positive voltage is applied to the anode of the fourth protection element while grounding the cathode of the fourth protection element, Vh2(I1) represents a voltage drop of the second protection element caused by the first current, Vr2 represents a negative resistance starting voltage in the negative resistance region of the second protection elements and Vr3 represents a negative resistance starting voltage in the negative resistance region of the third protection element. The semiconductor device further comprises a fifth protection element made up of a diode whose cathode is connected to the second node and whose anode is connected to the second wiring.

According to a fourth aspect of the present invention, a semiconductor device comprises: a signal terminal; a high potential side power supply terminal; a low potential side power supply terminal; a first wiring connected to the high potential side power supply terminal; a second wiring connected to the low potential side power supply terminal; an internal circuit to which power is supplied from the first and the second wirings; first and second resistance elements whose each one end is connected to a first node, the first node being at a wiring connecting the signal terminal with the internal circuit; a first protection element having a first terminal connected to the first wiring and a second terminal connected to the other end of the first resistance element, voltage-current characteristis of the first protection element when the second terminal is grounded having a negative resistance region and a holding region; a second protection element having a third terminal connected to the other end of the second resistance element and a fourth terminal connected to the second wiring, voltage-current characteristics of the second protection element when the fourth terminal is grounded having a negative resistance region and a holding region; a third protection element having a fifth terminal connected to the first wiring and a sixth terminal connected to the second wiring, the third protection element being made up of a MOS transistor, and voltage-current characteristics of the third protection element when the sixth terminal is grounded having a negative resistance region and a holding region; a fourth protection element made up of a diode whose anode is connected to a second node and whose cathode is connected to the first wiring, the second node being at the wiring connecting the signal terminal with the internal circuit; and a fifth protection element made up of a diode whose cathode is connected to the second node and whose anode is connected to the second wiring. The relations of "$Vh1(I2)+r1\times I2 \geq Vf5+Vr3>Vr1$" and "$Id1>I2$" are satisfied, where I2 represents a value of a second current flowing from the high potential side power supply terminal to the signal terminal via the first wiring, the first protection element and the first resistance element, Id1 represents a value of the second current when it causes destruction of the first protection element, r1 represents a resistance value of the first resistance element, Vf5 represents a voltage when a current starts to flow through the fifth protection element in case that a positive voltage is applied to the anode of the fifth protection element while grounding the cathode of the fifth protection element, Vh1(I2) represents a voltage drop of the first protection element caused by the second current, Vr1 represents a negative resistance starting voltage in the negative resistance region of the first protection element, and Vr3 represents a negative resistance starting voltage in the negative resistance region of the third protection element.

According to a fifth aspect of the present invention, a semiconductor device comprises: a signal terminal; a high potential side power supply terminal; a low potential side power supply terminal; a first wiring connected to the high potential side power supply terminal; a second wiring connected to the low potential side power supply terminal; an internal circuit to which power is supplied from the first and the second wirings; a first protection element having a first terminal connected to the first wiring and a second terminal connected to a first node, voltage-current characteristics of the first protection element when the second terminal is grounded having a negative resistance region and a holding region, and the first node being at a wiring connecting the signal terminal with the internal circuit; a second protection element having a third terminal connected to the first node and a fourth terminal connected to the second wiring, voltage-current characteristics of the second protection element when the fourth terminal is grounded having a negative resistance region and a holding region; a third protection element having a fifth terminal connected to the first wiring and a sixth terminal connected to the second wiring, the third protection element being made up of a MOS transistor, and voltage-current characteristics of the third protection element when the sixth terminal is grounded having a negative resistance region and a holding region; a fourth protection element made up of a diode whose anode is connected to a second node and whose cathode is connected to the first wiring, the second node being at the wiring connecting the signal terminal with the internal circuit closer to the signal terminal than the first node; a fifth protection element made up of a diode whose cathode is connected to the second node and whose anode is connected to the second wiring; and a resistance element connected to the first node and the second node therebetween. The relations of "Vh2(I1)+r3×I1≧Vf4+Vr3>Vr2" and "Id2>I1" are satisfied, where I1 represents a value of a first current flowing from the signal terminal to the low potential side power supply terminal via the resistance element, the second protection element and the second wiring, Id2 represents a value of the first current when it causes destruction of the second protection element, r3 represents a resistance value of the resistance element, Vf4 represents a voltage when a current starts to flow through the fourth protection element when a positive voltage is applied to the anode of the fourth protection element while grounding the cathode of the fourth protection element, Vh2(I1) represents a voltage drop of the second protection element caused by the first current, Vr2 represents a negative resistance starting voltage in the negative resistance region of the second protection element, and Vr3 represents a negative resistance starting voltage in the negative resistance region of the third protection element.

According to a sixth aspect of the present invention, a semiconductor device comprises: a signal terminal; a high potential side power supply terminal; a low potential side power supply terminal; a first wiring connected to the high potential side power supply terminal; a second wiring connected to the low potential side power supply terminal; an internal circuit to which power is supplied from the first and the second wirings; a first protection element having a first terminal connected to the first wiring and a second terminal connected to a first node, voltage-current characteristics of the first protection element when the second terminal is grounded having a negative resistance region and a holding region, and the first node being at a wiring connecting the signal terminal with the internal circuit; a second protection element having a third terminal connected to the first node and a fourth terminal connected to the second wiring, voltage-current characteristics of the second protection element when the fourth terminal is grounded having a negative resistance region and a holding region; a third protection element having a fifth terminal connected to the first wiring and a sixth terminal connected to the second wiring, the third protection element being made up of a MOS transistor, and voltage-current characteristics of the third protection element when the sixth terminal is grounded having a negative resistance region and a holding region; a fourth protection element made up of a diode whose anode is connected to a second node and whose cathode is connected to the first wiring, the second node being at the wiring connecting the signal terminal with the internal circuit closer to the signal terminal than the first node; a fifth protection element made up of a diode whose cathode is connected to the second node and whose anode is connected to the second wiring; and a resistance element connected to the first node and the second node therebetween. The relations of "Vh1(I2)+r3×I2≧Vf5+Vr3>Vr1" and "Id1>I2" are satisfied, where I2 represents a value of a second current flowing from the high potential side power supply terminal to the signal terminal via the first wiring, the first protection element and the resistance element, Id1 represents a value of the second current when it causes destruction of the first protection element, r3 represents a resistance value of the resistance element, Vf5 represents a voltage when a current starts to flow through the fifth protection element in case that a positive voltage is applied to the anode of the fifth protection element while grounding a cathode of the fifth protection element, Vh1(I2) represents a voltage drop of the first protection element caused by the second current I2, Vr1 represents a negative resistance starting voltage in the negative resistance region of the first protection element, and Vr3 represents a negative resistance starting voltage in the negative resistance region of the third protection element.

According to the present invention, it is possible to ensure necessary ESD resist quantity while suppressing increase of input capacity with size of ESD protection device that is provided just near the signal terminal minimized. Further, the semiconductor device is capable of returning to normal operation without breaking power supply after stresses such as surge by the ESD and the like are removed.

BRIEF DESCRIPTION OF THE DRAWINGS

FIG. 3A is a circuit diagram illustrating a protection circuit of a semiconductor circuit according to a third prior art, FIG. 3B is a cross sectional view illustrating a region corresponding to a protection circuit;

DETAILED DESCRIPTION OF THE PREFERRED EMBODIMENT

Preferred embodiments of the present invention will be described in detail referring to accompanying drawings below.

Figure 1A:
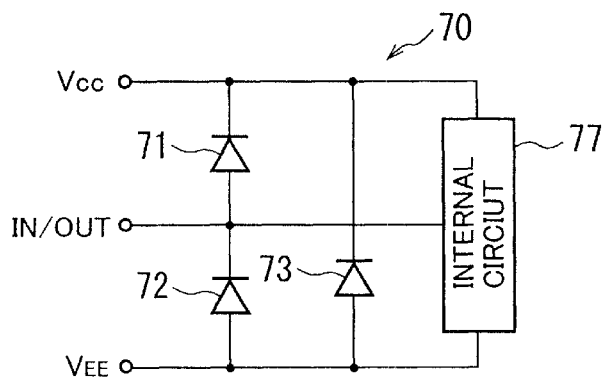
FIG. 1A is a circuit diagram illustrating a constitution of a semiconductor integrated circuit according to a first prior art.
Figure 1B:
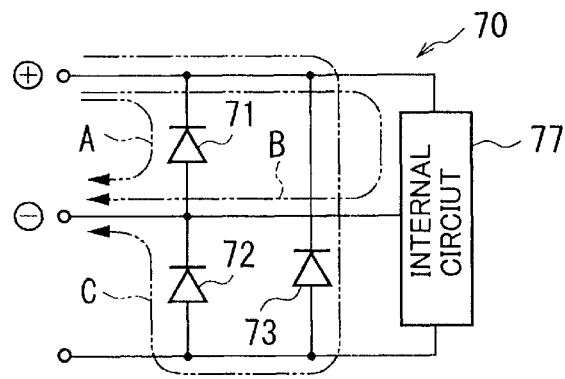
FIG. 1B is a circuit diagram illustrating operations of the semiconductor integrated circuit according to the first prior art.
Figure 2:
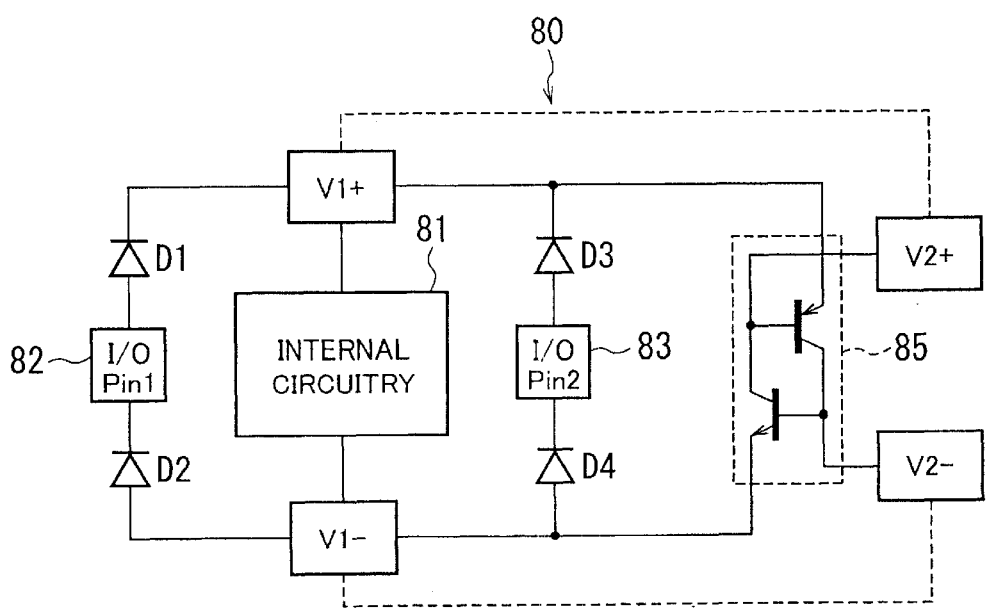
FIG. 2 is a block diagram illustrating a constitution of an ESD protection circuit of an integrated circuit (IC) 80 according to a second prior art.
Figure 4A:
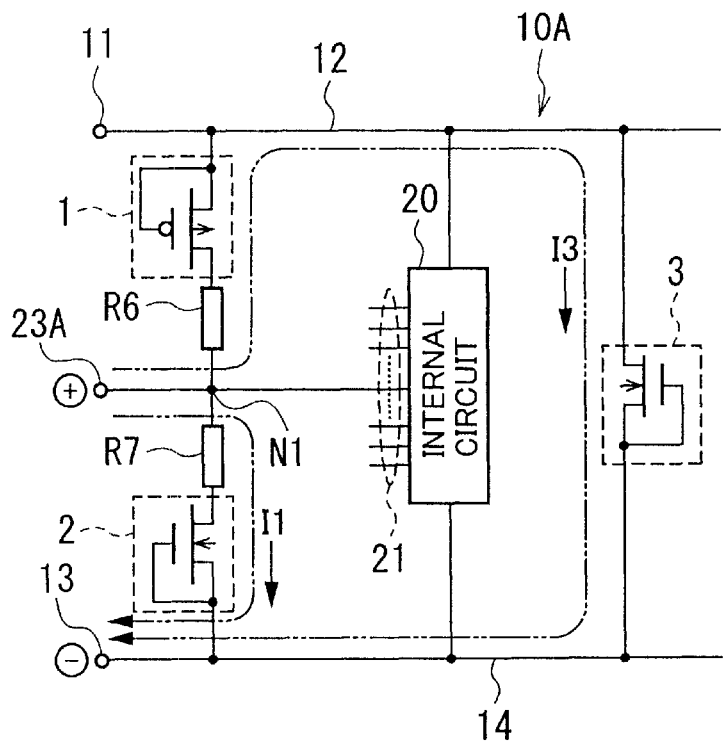
FIG. 4A and FIG. 4B are circuit diagrams illustrating connection condition of protection devices in the semiconductor device according to a first embodiment of the present invention.
Figure 4B:
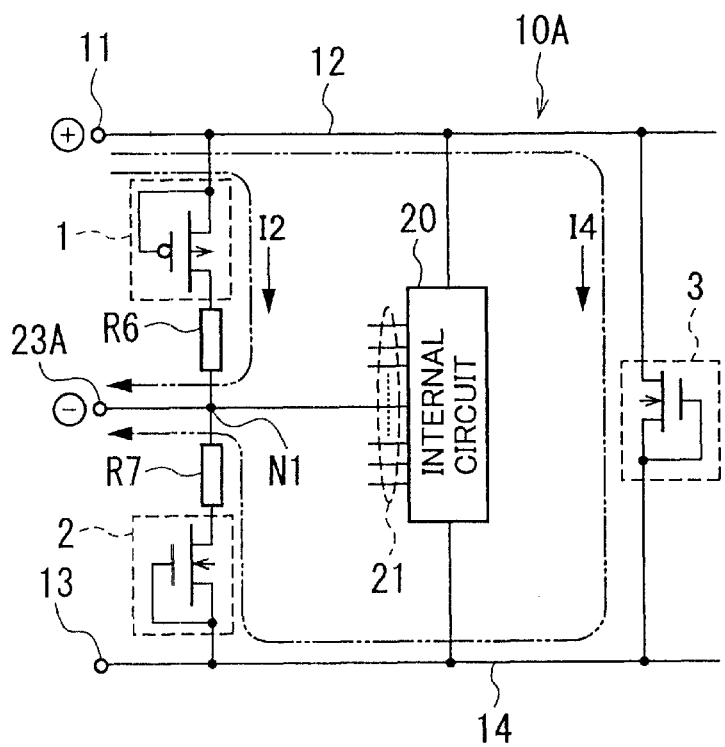

FIG. 4A and FIG. 4B are circuit diagrams illustrating connection condition of protection devices in the semiconductor device according to a first embodiment of the present invention, in which FIG. 4A is a circuit diagram illustrating a current path in cases where positive surge voltage is by ESD applied to a first signal terminal, followed by being discharged toward a low potential side power supply terminal, and FIG. 4B is a circuit diagram illustrating a current path in cases where a negative surge voltage by ESD is applied to the first signal terminal, followed by being discharged toward a high potential side power supply terminal.

A semiconductor device 10A according to the first embodiment is provided with a P-channel MOS transistor (a first protection element) 1, an N-channel MOS transistor (a second protection element) 2, an N-channel MOS transistor (a third protection element) 3, resistors (a first and a second resistance elements) R6 and R7, a high potential side power supply terminal (hereinafter referred to as $V_{dd}$ terminal) 11, a $V_{dd}$ wiring 12 connected to the $V_{dd}$ terminal, a low potential side power supply terminal (hereinafter referred to as GND terminal) 13, a GND wiring 14 connected to the GND terminal, an internal circuit 20, and a signal terminal group 21. The signal terminal group 21 contains, for example, a first signal terminal 23A.

Each one end of the resistors R6, R7 is connected to a first connection point (node) N1, which is on a wiring that is connected to the first signal terminal 23A and the internal circuit 20 therebetween. A gate of the MOS transistor 1 and a source (a first terminal) thereof are commonly connected to the $V_{dd}$ wiring 12. A drain (a second terminal) of the MOS transistor 1 is connected to the other end of the resistor R6. A drain (a third terminal) of the MOS transistor 2 is connected to the other end of the resistor R7. A gate (a fourth terminal) of the MOS transistor 2 and a source thereof are commonly connected to the GND wiring 14. A drain (a fifth terminal) of the MOS transistor 3 is connected to the $V_{dd}$ wiring 12. A gate (a sixth terminal) of the MOS transistor 3 and a source thereof are commonly connected to the GND wiring 14.

Figure 5:
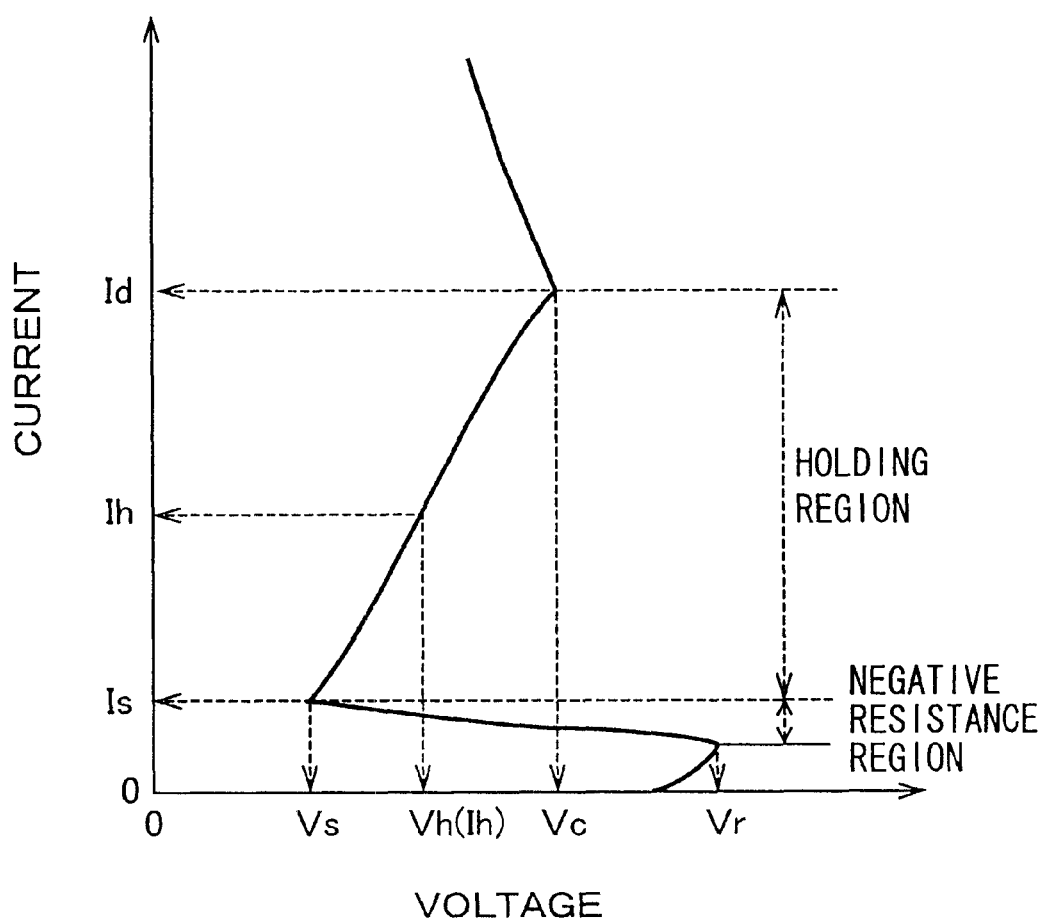
FIG. 5 is a graph illustrating schematically voltage-current characteristics of an N-channel MOS transistor.

Next, voltage-current characteristics will be described when the gate and source of an N-channel MOS transistor and a substrate are grounded, and positive voltage is applied to the drain. FIG. 5 is a graph schematically illustrating voltage-current characteristics of an N-channel MOS transistor. A horizontal axis of FIG. 5 indicates applied voltage, and a vertical axis indicates current. Characteristics illustrated in FIG. 5 are generally called as snapback characteristics.

When high voltage is applied to the drain, electric discharge is started between the source and the drain. After that, as the drain current increases, the drain voltage increases to a certain maximum value (snapback starting voltage Vr) once. When the drain voltage increases to the maximum value, the drain voltage decreases while falling within a negative resistance region, then, the drain voltage indicates the minimum value (holding starting voltage Vs) when current amounts to holding starting current Is. After that, the drain voltage (holding voltage Vh(Ih)) increases again with increasing the drain current (holding current Ih). When further increasing the drain voltage, also increasing the drain current, destruction of the MOS transistor occurs as the drain current amounts to a certain current value Id. Moreover, although detailed description is omitted, similar snapback characteristics can be obtained when grounding a dtalt Of a P-channel MOS transistor, and applying a common positive voltage to a gate and a source of the P-channel MOS transistor and a substrate.

Consequently, as for the protection device in which a first terminal is a drain of the N-channel MOS transistor and a second terminal is a common connection between a gate and a source of the N-channel MOS transistor, and as for the protection device in which a first terminal is a common connection between a gate and a source of the P-channel MOS transistor and a second terminal is a drain of the P-channel MOS transistor, the snapback starting voltage Vr, the holding starting voltage Is, the holding starting voltage Vs, the holding current Ih and holding voltage Vh(Ih) are a negative resistance starting voltage, a holding starting current, a holding starting voltage, and a current and a voltage for holding region for each protection device. On the basis of these decisions, in the present invention, Vr1, Vr2, Vr3 are defined as respective negative resistance starting voltages of the first, the second, the third protection devices, Is1, Xs2, Is3 are defined as respective holding starting currents of the first, the second, the third protection devices, Vs1, Vs2, Vs3 are defined as respective holding starting voltages of the first, the second, the third protection devices, Ih1, Ih2, Ih3 are defined as respective holding currents of the first, the second, the third protection devices, Vh1(Ih1), Vh2(Ih2), Vh3(Ih3) are defined as respective holding voltages of the first, the second, the third protection devices.

Further, I1 is defined as a value of a current flowing through the GND terminal 13 via the resistor R7, the N-channel MOS transistor 2 and the CND wiring 14 from the first signal terminal 23A as positive surge voltage by ESD is applied to the first signal terminal 23A, and it is discharged toward the GND terminal 13. Id2 is defined at a current value when destruction of the N-channel MOS transistor 2 occurs caused by the current I1. I3 is defined as a value of a current flowing through the GND terminal 13 via the resistor R6, the P-channel MOS transistor 1, the $V_{dd}$ wiring 12, the N-channel MOS transistor 3 and the GND wiring 14 from the first signal terminal 23A.

I2 is defined as a value of a current flowing through the first signal terminal 23A via the $V_{dd}$ wiring 12, the P-channel MOS transistor 1 and the resistor R6 from the $V_{dd}$ terminal 11 as the negative surge voltage by ESD is applied to the first signal terminal 23A and then it is discharged toward the $V_{dd}$ terminal 11. Id1 is defined as a current value when destruction of the P-channel MOS transistor 1 occurs caused by the current I2. I4 is defined as a value of a current flowing through the first signal terminal 23A via the $V_{dd}$ wiring 12, the N-channel MOS transistor 3, the GND wiring 14, the N-channel MOS transistor 2 and the resistor R7 from the $V_{dd}$ terminal 11.

Respective r1, r2 are defined as resistance values of the resistors R6, R7.

Vh2(I1) is defined as voltage drop of the N-channel MOS transistor 2 caused by the current I1. Vh1(I2) is defined as voltage drop of the P-channel MOS transistor 1 caused by the current I2. Vf1 is defined as a voltage at the time that a current starts to flow to a drain of the P-channel MOS transistor 1 as positive voltage is applied to the drain while grounding the gate and source of the P-channel MOS transistor 1 and the substrate. Vf2 is defined as a voltage at the time that a current starts to flow to the drain of the N-channel MOS transistor 2 as common positive voltage is applied to the gate and source of the N-channel MOS transistor 2 and the substrate while grounding the drain of the N-channel MOS transistor 2.

In the present embodiment, when positive surge by ESD is applied to the first signal terminal 23A and then it is discharged toward the CND terminal 13, condition setting is made to execute so that following equation (1) is satisfied:

$$Vh2(I1)+r2 \times I1 \geq Vf1+Vr3>Vr2 \qquad (1)$$

(Frovided, Id2>I1)

Furthermore, when negative surge by ESD is applied to the first signal terminal 23A and then it is discharged toward the Vdd terminal 11, condition setting is made to execute so that following equation (2) is satisfied:

$$Vh1(I2)+r1 \times I2 \geq Vf2+Vr3>Vr1 \qquad (2)$$

(Provided, Id1>I2)

In the present embodiment, in order to suppress, to the at most, increase of input capacitance of the first signal terminal 23A, the first and the second protection devices may be made up of the small sized P-channel MOS transistor 1 and N-channel Mos transistor 2, respectively. Furthermore, the first and the second resistance devices of the resistors R6, R7 are connected to these transistors, respectively. Moreover, the third protection device may be made up of the sufficiently large sized N-channel MOS transistor 3. Snapbaok starting voltage of respective protection devices is set so as to satisfy the above-described equations (1) and (2).

In such a constitution of the first embodiment, for instance, when positive surge voltage by ESD is applied to the first signal terminal 23A, the surge voltage by ESD is discharged toward the GND terminal 13. In this case, as indicated by equation (1), since the snapback starting voltage Vr2 of the N-channel MOS transistor 2 is smaller than the sum of the snapback starting voltage Vr3 of the N-channel MOS transistor 3 and the voltage Vf1, snapback occurs at the N-channel MOS transistor 2, then, the surge current starts to flow toward the GND terminal 13 via the resistor R7 and the N-channel MOS transistor 2. The voltage Vf1 corresponds to forward rising voltage of pn-junction between the drain and source of the P-channel MOS transistor 1 and the substrate.

When current starts to flow in such a path, electric potential of the first connection point N1 increases with the N-channel MOS transistor 2 and the resistor R7. The N-channel Mos transistor 2 and the resistor R7 are set so that a voltage applied to the N-channel MOS transistor 3 exceeds the Vr3 with sufficiently small current value I1 that causes no occurrence of destruction of the N-channel MOS transistor 2. Accordingly, snapback occurs at the N-channel MOS transistor 3, then, the Burge current starts to flow also through the GND terminal 13 as a current I3 from a path via the resistor R6, the P-channel MOS transistor 1 and the N-channel MOS transistor 3. size of the N-channel MOS transistor 3 is large, and the N-channel MOS transistor 3 is set so that the holding voltage after the snapback becomes sufficiently low. Accordingly, after occurrence of the snapback of the N-channel MOS transistor 3, almost all the surge current is discharged as the current I3. As a result, increase of the current that flows through the N-channel MOS transistor 2 is not more than I1, destruction of the N-channel MOS transistor 2 never occurs. The large current I3 that accounts for a great part of the surge current flows through the P-channel MOS transistor 1. However, the current I3 flows in the forward direction through the pn-junction between the drain and source of the P-channel MOS transistor 1 and the substrate. For that reason, large potential difference does not occur. Accordingly, since power consumption and heat generation at the part of the P-channel MOS transistor 1 are minimized, even though the size thereof is minimized, destruction does not occur.

On the other hand, for instance, when the negative surge voltage by ESD is applied to the first signal terminal 23A, the surge voltage by ESD is discharged toward the $V_{dd}$ terminal 11. In this case, as indicated in equation (2), it Since the snapback starting voltage Vr1 of the P-channel MOS transistor 1 is smaller than the sum of the snapback starting voltage Vr3 of the N-channel MOS transistor 3 and the voltage Vf2, first, snapback occurs at the P-channel MOS transistor 1, then, the surge current starts to flow through the first signal terminal 23A via the resistor As and the P-channel MOS transistor 1. The voltage Vf2 corresponds to a forward rising voltage of pn-junction between the drain and source of the N-channel MOS transistor 2 and the substrate.

When current starts to flow in such a path, electric potential of the $V_{dd}$ wiring 12 increases with the P-channel MOS transistor 1 and the resistor R6. The P-channel MOS transistor 1 and the resistor R6 are set so that a voltage applied to the N-channel KOS transistor 3 exceeds the Vr3 with sufficiently small current I2 that causes no destruction of the P-channel MOS transistor 1. Accordingly, snapback occurs at the N-channel MOS transistor 3, then, the surge current starts to flow also through the first signal terminal 23A as the current I4 from a path via the N-channel MOS transistor 3, the N-channel MOS transistor 2 and the resistor R7.

Size of the N-channel MOS transistor 3 is large, and the N-channel NOS transistor 3 is set so that the holding voltage after snapback becomes sufficiently low. Accordingly, after the snapback occurs at the N-channel MOS transistor 3, large part of the surge current is discharged as the current I4. As a result, increase of the current which flows through the P-channel MOS transistor 1 is not more than I2, and destruction of the P-channel MOS transistor 1 never occurs. The large current I4 amounting for large part of the surge current flows through the N-channel MOS transistor 2. However, the current I4 flows through the pn-junction in the forward direction between the drain and source of the N-channel mOS transistor 2 and the substrate. For that reason, large potential difference does not occur. Accordingly, since power consumption and heat generation at the part of the N-channel MOS transistor 2 become small, even though the size thereof is minimized, destruction does not occur.

Further, the third protection device, which is on the path for discharging large part of the surge current, is made up of the large sized N-channel MOS transistor 3. When the surge voltage by ESD that causes the discharge current to flow from the drain of the N-channel MOS transistor 3 to the gate thereof is applied thereto, the voltage drop at the part of the N-channel MOS transistor 3 is capable of being sufficiently minimized with the snapback characteristics of the N-channel MOS transistor 3. Furthermore, if the surge voltage by ESD disappears, the N-channel MOS transistor 3 is returned to non-conductive condition without breaking power supply essential to such as a thyristor device.

Next, the second embodiment of the present invention will be described.

Figure 6A:
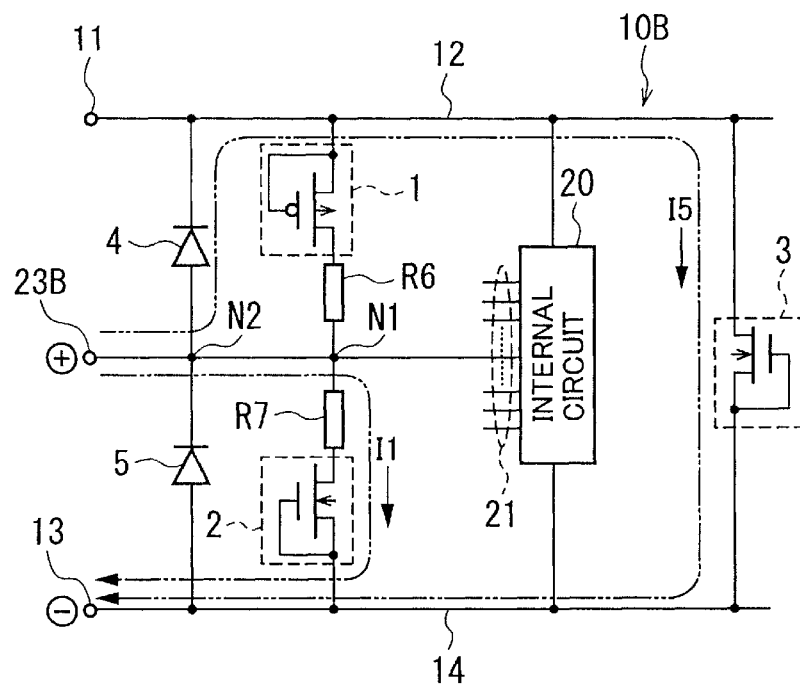
FIG. 6A and FIG. 6B are circuit diagrams illustrating connection condition of protection devices in the semiconductor device according to a second embodiment of the present invention.
Figure 6B:
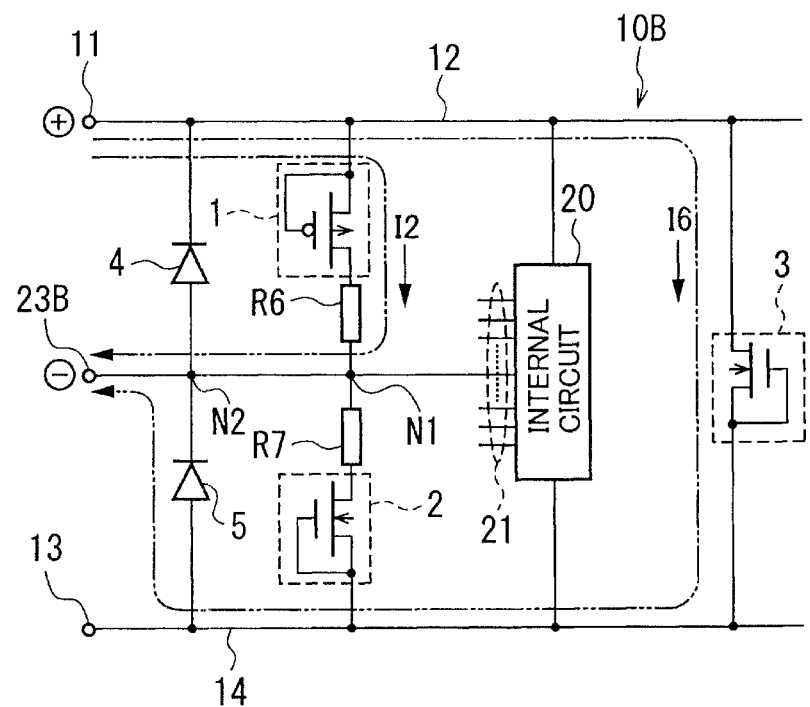

FIG. 6A and FIG. 6B are circuit diagrams illustrating connection condition of protection devices in the semiconductor device according to the second embodiment of the present invention, in which FIG. 6A is a circuit diagram illustrating a current path in cases where positive surge voltage by ESD is applied to a first signal terminal, followed by being discharged toward a low potential side power supply terminal, and FIG. 6B is a circuit diagram illustrating a current path in cases where negative surge voltage by ESD is applied to the first signal terminal, followed by being discharged toward a high potential side power supply terminal.

A semiconductor device 10B according to the second embodiment is provided with a P-channel MOS transistor (a first protection element) 1, an N-channel MOS transistor (a second protection element) 2, an N-channel MOS transistor (a third protection element) 3, a diode (a fourth protection element) 4, a diode (a fifth protection element) 5, resistors (a first and a second resistance elements) R6 and R7, a $V_{dd}$ terminal 11, a $V_{dd}$ wiring 12 connected to the $V_{dd}$ terminal, a GND terminal 13, a GND wiring 14 connected to the GND terminal, an internal circuit 20, and a signal terminal group 21. The signal terminal group 21 contains, for example, a first signal terminal 23B.

Each one end of the resistors R6, R7 is connected to a first connection point N1, which is on a wiring that is connected to the first signal terminal 23B and the internal circuit 20 therebetween. A gate of the MOS transistor 1 and a source thereof are commonly connected to the $V_{dd}$ wiring 12. A drain of the MOS transistor 1 is connected to the other end of the resistor R6. A drain of the MOS transistor 2 is connected to the other end of the resistor R7. A gate of the MOS transistor 2 and a source thereof are commonly connected to the GND wiring 14. A drain of the MOS transistor 3 is connected to the $V_{dd}$ wiring 12. A gate of the MOS transistor 3 and a source thereof are commonly connected to the GND wiring 14. Further, the anode of the diode 4 and the cathode of the diode 5 are connected to a second connection point (node) N2 existing on the wiring that in connected to the first signal terminal 23B and the internal circuit 20 therebetween. The cathode of the diode 4 is connected to the $V_{dd}$ wiring 12, and the anode of the diode 5 is connected to the GND wiring 14. The second connection point N2 is provided at a position closer to the first signal terminal 239 than the first connection point N1.

Hereinafter, respective Vr4, Vr5 are defined as avalanche breakdown voltages of the diodes 4, 5, and respective Vf4, vf5 are refined as forward rising voltages of the diodes 4, 5.

Further, I1 is defined as a value of a current flowing through the GND terminal 13 via the resistor R7, the N-channel MOS transistor 2 and the GND wiring 14 from the first signal terminal 23B when positive surge voltage by ESD iS applied to the first signal terminal 23B and it is discharged toward the GND terminal 13. I5 is defined as a value of a current flowing through the GND terminal 13 via the diode 4, the $V_{dd}$ wiring 12, the N-channel MOS transistor 3 and the GND wiring 14 from the first signal terminal 23B.

I2 is defined as a value of a current flowing through the first signal terminal 23B via the Vdd wiring 12, the P-channel MOS transistor 1 and the resistor R6 from the $V_{dd}$ terminal 11 when negative surge voltage by ESD is applied to the first signal terminal 23B and it is discharged toward the $V_{dd}$ terminal 11. I6 is defined as a value of a current flowing through the first signal terminal 23B via the $V_{dd}$ wiring 12, the N-channel MOS transistor 3, the GND wiring 14 and the diode 5 from the $V_{dd}$ terminal 11.

In the present embodiment, when the positive surge by ESD is applied to the first signal terminal 23B and it is discharged toward the GND terminal 13, setting condition is made to execute so that following equation (3) is satisfied:

$$Vh2(I1)+r2\times I1 \geq Vf4+Vr3>Vr2 \qquad (3)$$

(Provided, Id2>I1)

$$Vr5>Vf4+Vr3 \qquad (3a)$$

$$Vf1>Vf4 \qquad (3b)$$

Further, when the negative surge by ESD is applied to the first signal terminal 23B and it is discharged toward the $V_{dd}$ terminal 11, setting condition is made to execute so that the following equation (4) is satisfied:

$$Vh1(I2)+r1\times I2 \geq Vf5+Vr3>Vr1 \qquad (4)$$

(Provided, Id1>I2)

$$Vr4>Vf5+Vr3 \qquad (4a)$$

$$Vf2>Vf5 \qquad (4b)$$

In the present embodiment, the diodes 4 and 5 are connected to the first signal terminal 23B as the fourth and the fifth protection elements in addition to the ESD protection constitution in the first embodiment. Further, in order to suppress increase of input capacitance, size of the diodes 4 and 5 are minimized as small as possible. The snapback starting voltage or the avalanche breakdown voltage of respective protection devices is set so as to satisfy the above-described equations (3), (3a) and (3b) and equations (4), (4a) and (4b).

In such a constitution of the second embodiment, for instance, when the positive surge voltage by ESD is applied to the first signal terminal 23B, the surge voltage by ESD is then discharged toward the GND terminal 13. In this case, as indicated in equation (3), since the snapback starting voltage Vr2 of the N-channel MOS transistor 2 is smaller than the sum of the snapback starting voltage Vr3 of the N-channel MOS transistor 3 and the forward rising voltage Vf4 of the diode 4, first, snapback occurs at the N-channel MOS transistor 2, then the surge current starts to flow through the GND terminal 13 via the resistor R7 and the N-channel HOS transistor 2.

When a current starts to flow in such a path, electric potential of the first connection point N1 increases with the N-channel MOS transistor 2 and the resistor R7. The N-channel MOS transistor 2 and the resistor R7 are set so that a voltage applied to the N-channel MOS transistor 3 exceeds the Vr3 with sufficiently small current value II that causes no destruction of the N-channel MOS transistor 2. Accordingly, snapback occurs at the N-channel MOS transistor 3, then, the surge current starts to flow also through the GND terminal 13 as a current I5 from a path via the diode 4 and the N-channel MOS transistor 3.

Size of the N-channel MOS transistor 3 is large, and the N-channel MOS transistor 3 is set so that the holding voltage after the snapback becomes sufficiently low. Accordingly, after occurrence of the snapback of the N-channel MOS transistor 3, almost all the surge current is discharged as the current IS. As a result, increase of the current that flows through the N-channel NOS transistor 2 is not more than 11 that causes no destruction of the N-channel MOS transistor 2. The large current I5 that accounts for large part of the surge current flows through the diode 4. However, the current I5 flows in the forward direction of the diode 4. For that reason, large potential difference does not occur. Accordingly, since power consumption and heat generation at the part of the diode 4 are minimized, even though the size thereof is minimized, destruction does not occur.

Moreover, in the present embodiment, when the positive surge voltage by ESD is discharged toward the GND terminal 13, discharge current hardly flows through series connection body of the P-channel MOS transistor 1 and the resistor R6 because of existence of the diode 4. Accordingly, even though the P-channel MOS transistor 1 is minimized on its size, no destruction occurs as a matter of course.

On the other hand, for instance, when the negative surge voltage by ESD is applied to the first signal terminal 23B, the surge voltage by ESD is discharged toward the $V_{dd}$ terminal 11. In this case, as indicated in equation (4), since the snapback starting voltage Vr1 of the P-channel MOS transistor 1 is smaller than the sum of the snapback starting voltage Vr3 of the N-channel MOS transistor 3 and the forward rising voltage Vf5 of the diode 5, first, snapback occurs at the P-channel MOS transistor 1, then, a surge current starts to flow through the first signal terminal 23B via the resistor R6 and the P-channel MOS transistor 1.

When current starts to flow in such a path, electric potential of the $V_{dd}$ wiring 12 increases with the P-channel fOS transistor 1 and the resistor R6. the P-channel MOS transistor 1 and the resistor R6 are set so that a voltage applied to the N-channel MOS transistor 3 exceeds the Vr3 with sufficiently small current I2 that causes no destruction of the P-channel MOS transistor 1. Accordingly, snapback occurs at the N-channel MOS transistor 3, then, the surge current starts to flow also through the first signal terminal 23B as the current I6 from a path via the N-channel MOS transistor 3 and the diode 5.

Size of the N-channel NOS transistor 3 is large, and the N-channel MOS transistor 3 is set so that the holding voltage after the snapback becomes sufficiently low. Accordingly, after the snapback occurs at the N-channel MOS transistor 3, large part of the surge current is discharged as the current 16. As a result, increase of the current which flows through the P-channel MOS transistor 1 is not more than 12, and destruction of the P-channel MOS transistor 1 never occurs. The large current I6 amounting for great part of the surge current flows through the diode 5. However, the current I6 flows through the diode 5 in forward direction. For that reason, large potential difference does not occur. Accordingly, since power consumption and heat generation at the part of the diode 5 become small, even though the size thereof is minimized, destruction does not occur.

Moreover, in this case, discharge current hardly flows through series connection body of the N-channel MOS transistor 2 and the resistor R7 because of existence of the diode 5. Accordingly, even though the N-channel MOS transistor 2 is minimized on its size, no destruction occurs as a matter of course.

It should be noted that the N-channel MOS transistor 3 operates like the first embodiment.

Next, a third embodiment of the present invention will be described.

Figure 7A:
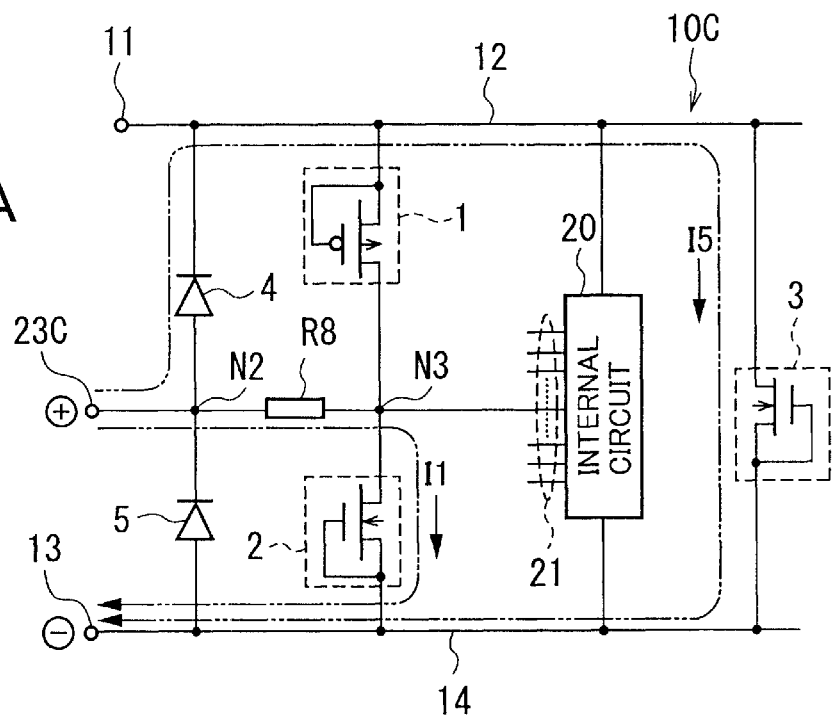
FIG. 7A and FIG. 7B are circuit diagrams illustrating connection condition of protection devices in the semiconductor device according to a third embodiment of the present invention.
Figure 7B:
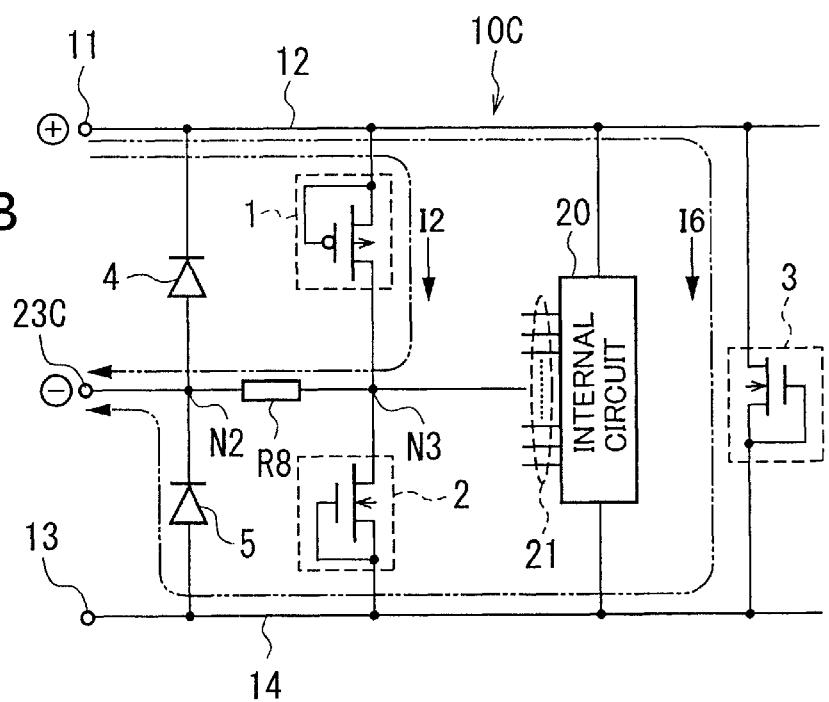

FIG. 7A and FIG. 7B are circuit diagrams illustrating connection condition of protection devices in the semiconductor device according to the third embodiment of the present invention, in which FIG. 7A is a circuit diagram illustrating a current path in cases where positive surge voltage by ESD is applied to a first signal terminal, followed by being discharged toward a low potential side power supply terminal, and FIG. 7B is a circuit diagram illustrating a current path in cases where a negative surge voltage by ESD is applied to the first signal terminal, followed by being discharged toward a high potential side power supply terminal.

A semiconductor device 10C according to the third embodiment is provided with a P-channel MOS transistor (a first protection element) 1, an N-channel MOS transistor (a second protection element) 2, an N-channel MOS transistor (a third protection element) 3, a diode (a fourth protection element) 4, a diode (a fifth protection element) 5, a resistor (a third resistance element) R8, a $V_{dd}$ terminal 11, a $V_{dd}$ wiring 12 connected to the $V_{dd}$ terminal, a GND terminal 13, a GND wiring 14 connected to the GND terminal, an internal circuit 20, and signal terminal group 21, The signal terminal group 21 contains, for example, a first signal terminal 23C.

A drain of the P-channel KOS transistor 1 and a drain of the N-channel MOS transistor 2 are connected to a third connection point (node) N3, which is on a wiring that is connected to the first signal terminal 23C and the internal circuit 20 therebetween. A gate of the MOS transistor 1 and a source thereof are commonly connected to the $V_{dd}$ wiring 12. A gate of the MOS transistor 2 and a source thereof are commonly connected to the GND wiring 14. A drain of the MOS transistor 3 is connected to the $V_{dd}$ wiring 12. A gate of the MOS transistor 3 and a source thereof are commonly connected to the GND wiring 14. Further, the anode of the diode 4 and the cathode of the diode 5 are connected to a second connection point N2, which is on the wiring connected to the first signal terminal 23C and the internal circuit 20 therebetween. The cathode of the diode 4 is connected to the $V_{dd}$ wiring 12, and the anode of the diode 5 is connected to the GND wiring 14. The second connection point N2 is provided at a position closer to the first signal terminal 23C than the third connection point N3. The resistor R8 is connected to the second connection point N2 and the third connection point N3 therebetween.

Hereinafter, r3 is defined as a resistance value of the resistor R8.

Further, I1 is defined as a value of a current flowing through the GND terminal 13 via the resistor R8, the N-channel MOS transistor 2 and the GND wiring 14 from the first signal terminal 23C when positive surge voltage by ESD is applied to the first signal terminal 23C and it is discharged toward the GND terminal 13. I5 is defined at a value of a current flowing through the GND terminal 13 via the diode 4, the $V_{dd}$ wiring 12, the N-channel MOS transistor 3 and the GND wiring 14 from the first signal terminal 23C.

I2 is defined as a value of a current flowing through the first signal terminal 23C via the $V_{dd}$ wiring 12, the P-channel MOS transistor 1 and the resistor RB from the $V_{dd}$ terminal 11 when negative surge voltage by ESD is applied to the first signal terminal 23C and it is discharged toward the $V_{dd}$ terminal 11. I6 is defined as a value of a current flowing through the first signal terminal 23C via the $V_{dd}$ wiring 12, the N-channel MOS transistor 3, the GND wiring 14 and the diode 5 from the $V_{dd}$ terminal 11.

In the present embodiment, when the positive surge by ESD is applied to the first signal terminal 23C and it is discharged toward the GND terminal 13, setting condition is made to execute so that following equation (5) is satisfied:

$$Vh2(I1)+r3\times I1 \geq Vf4+Vr3 > Vr2 \qquad (5)$$

(Provided, Id2>I1)

$$Vr5 > Vf4+Vr3 \qquad (5a)$$

Further, when the negative surge by ESD is applied to the first signal terminal 23C and it is discharged toward the $V_{dd}$ terminal 11, setting condition is made to execute so that the following equation (6) is satisfied:

$$Vh1(I2)+r3\times I2 \geq Vf5+Vr3 > Vr1 \qquad (6)$$

(Provided, Id1>I2)

$$Vr4 > Vf5+Vr3 \qquad (6a)$$

In the present embodiment, in order to suppress, to the at most, increase of input capacitance of the first signal terminal 23C, the first and the second protection elements may be made up of the small sized P-channel MOS transistor 1 and N-channel MOS transistor 2, respectively. Further, the fourth and the fifth protection elements may be made up of the small sized diodes 4 and 5, respectively. The snapback starting voltage or the avalanche breakdown voltage of respective protection devices is act so as to satisfy the above-described equations (5) and (5a) and equations (6) and (6a).

In such a constitution of the third embodiment, for instance, when the positive surge voltage by ESD is applied to the first signal terminal 23C, the surge voltage by ESD is then discharged toward the GND terminal 13. In this case, as indicated in equation (5), since the snapback starting voltage Vr2 of the N-channel MOS transistor 2 is smaller than the sum of the snapback starting voltage Vr3 of the N-channel MOS transistor 3 and the forward rising voltage Vf4 of the diode 4, first, snapback occurs at the N-channel MOS transistor 2, then, the surge current starts to flow through the GND terminal 13 via the resistor R8 and the N-channel MOS transistor 2.

When current starts to flow in such a path, electric potential of the second connection point N2 increases with the N-channel MOS transistor 2 and the resistor R8. The N-channel MOS transistor 2 and the resistor R8 are set so that a voltage applied to the N-channel MOS transistor 3 exceeds the Vr3 with sufficiently small current value I1 that causes no destruction of the N-channel MOS transistor 2. Accordingly, snapback occurs at the N-channel MOS transistor 3, then, the surge current starts to flow also through the GND terminal 13 as a current I5 from a path via the diode 4 and the N-channel MOS transistor 3.

Size of the N-channel MOS transistor 3 is large, and the N-channel MOS transistor 3 is set so that the holding voltage after the snapback becomes sufficiently low. Accordingly, after occurrence of the snapback of the N-channel MOS transistor 3, almost all the surge current is discharged as the current I5. As a result, increase of the current that flows through the N-channel MOS transistor 2 is not more than I1, destruction of the N-channel MOS transistor 2 never occurs. The large current I5 that accounts for large part of the surge current flows through the diode 4. However, the current I5 flows in the forward 33 direction of the diode 4. For that reason, large potential difference does not occur. Accordingly, since power consumption and heat generation at the part of the diode 4 are minimized, even though the size thereof is minimized, destruction does not occur.

Moreover, in the present embodiment, when the positive surge voltage by ESO is discharged toward the GND terminal 13, discharge current hardly flows through the path via the resistor R8 and the P-channel MOS transistor 1 because of existence of the diode 4. Accordingly, even though the P-channel MOS transistor 1 is minimized on its size, no destruction occurs as a matter of course.

On the other hand, for instance, when the negative surge voltage by ESD is applied to the first signal terminal 23C, the surge voltage by ESD is discharged toward the $V_{dd}$ terminal 11. In this case, as indicated in equation (6), since the snapback starting voltage Vr1 of the P-channel MOS transistor 1 is smaller than the sum of the snapback starting voltage Vr3 of the N-channel MOS transistor 3 and the forward rising voltage Vf5 of the diode 5, first, snapback occurs at the P-channel MOS transistor 1, then, a surge current starts to flow through the first signal terminal 23C via the resistor R8 and the P-channel MOS transistor 1.

When current starts to flow in such a path, electric potential of the $V_{dd}$ wiring 12 increases with the P-channel MOS transistor 1 and the resistor R8. The P-channel MOS transistor 1 and the resistor R8 are set so that a voltage applied to the N-channel MOS transistor 3 exceeds the Vr3 with sufficiently small current I2 that causes no destruction of the P-channel MOS transistor 1. Accordingly, snapback occurs at the N-channel MOS transistor 3, then, the surge current starts to flow also through the first signal terminal 23C as the current I6 from a path via the N-channel MOS transistor 3 and the diode 5.

Size of the N-channel MOS transistor 3 is large, and the N-channel MOS transistor 3 is set so that the holding voltage after the snapback becomes sufficiently low. Accordingly, after the snapback occurs at the N-channel MOS transistor 3, great part of the surge current is discharged as the current I6. As a result, increase of the current which flows through the P-channel MOS transistor 1 is not more than I2, and destruction of the P-channel MOS transistor 1 never occurs. The large current I6 amounting for large part of the surge current flows through the diode 5. However, the current I6 flows through the diode 5 in forward direction. For that reason, large potential difference does not occur. Accordingly, since power consumption and heat generation at the part of the diode 5 become small, even though the size thereof is minimized, destruction does not occur.

Moreover, in this case, discharge current hardly flows through the path via the N-channel MOS transistor 2 and the resistor R8 because of existence of the diode 5. Accordingly, even though the N-channel MOS transistor 2 is minimized on its size, no destruction occurs as a matter of course.

It should be toted that the N-channel MOS transistor 3 operates like the first embodiment.

Figure 8A:
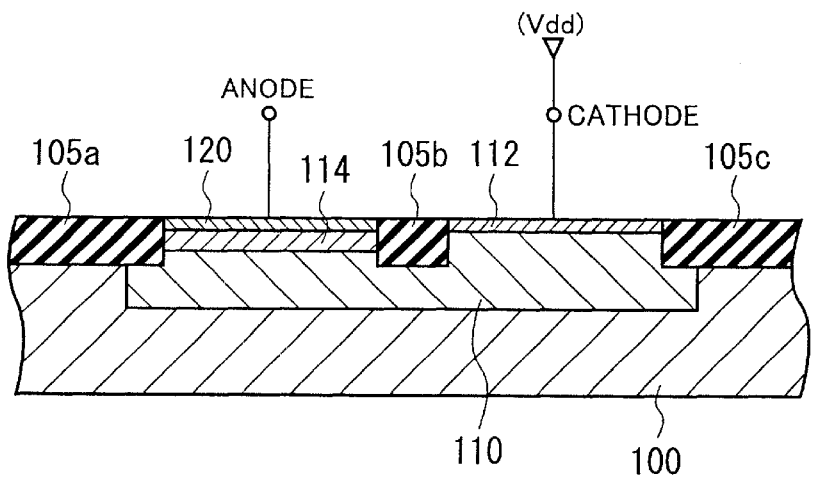
FIG. 8A and FIG. 8B are cross sectional views illustrating embodiments of structures of respective diodes 4, 5.
Figure 8B:
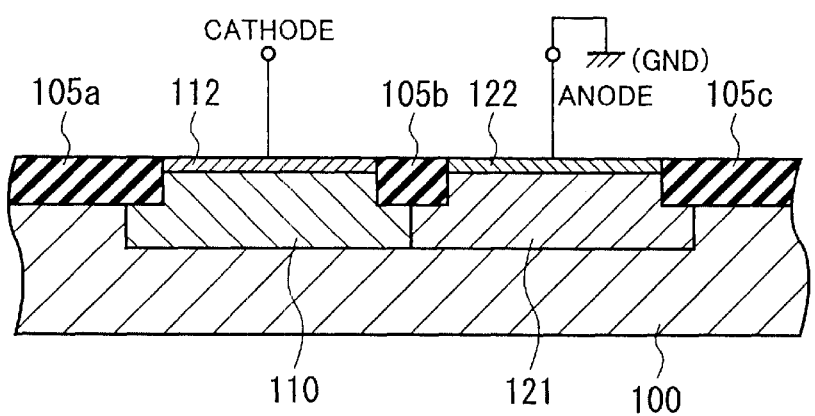

As for a structure of the diodes 4 and 5 in the second and the third embodiments, for sufficient avalanche breakdown voltage, it is possible to adopt a diode, for instance, illustrated in FIG. 8A or FIG. 8B.

About the diode 4, as illustrated in FIG. 8A, an n-type diffused region 110 is formed at a surface of a p-type silicon substrate 100. The n-type diffused region 110 has, for instance, impurity concentration and diffusion depth identical to those of an n-well for use in general CMOS transistor. Further, the n-type diffused region 110 is positioned within a region defined by insulating films 105a and 105c with STI (Shallow Trench Isolation). A p-type diffused region 120 is formed in the n-type diffused region 110. The p-type diffused region 120 is positioned within a region defined by the insulating films 105a and an insulating film 105b with STI. A low concentrated region 114 just below the p-type diffused region 120 is formed adjacent to the p-type diffused region 120. The n-type impurity concentration of the low concentrated region 114 is lower than that of the p-type diffused region 120. The p-type diffused region 120 is approximately integrated with a contact region connected to wiring.

Further, an n-type contact region 112 that connects the n-type diffused region with a wiring is formed on the surface of the n-type diffused region 110. The n-type contact region 112 is positioned within a region defined by the insulating films 105b and 105c.

Each impurity concentration of the n-type diffused region 110, the n-type contact region 112, the p-type diffused region 120, the n-type low concentration region 114 correspond to, for instance, each degree of $1 \times 10^{18}/cm^3$, $1 \times 10^{20}/cm^3$, $1 \times 10^{20}/cm^3$, $1 \times 10^{17}/cm^3$.

About the diode 5, as illustrated in FIG. 8B, an n-type diffused region 110 and a p-type diffused region 121 are formed at the surface of a p-type silicon substrate 100. The n-type diffused region 110 and the p-type diffused region 121 have impurity concentration and diffusion depth identical to each an n-well, a p-well for use in general CMOS transistor. The n-type diffused region 110 is positioned within a region defined by insulating films 105a and 105b with STI, and the p-type diffused region 121 is positioned within a region defined by the insulating film 105b and an insulating film 105c with STI. The n-type diffused region 110 functions as a cathode, and the p-type diffused region 121 functions as an anode.

Further, impurity concentration in the p-type diffused region 110 and the p-type diffused region 121 are, for instance, degree of $1 \times 10^{18}/cm^3$. Furthermore, an n-type contact region 112 and a p-type contact region 122 are provided between each of the diffused regions and wiring. Impurity concentrations of the n-type contact region 112 and the p-type contact region 122 are, for instance, degree of $1 \times 10^{20}/cm^3$, which is higher than those of respective diffused regions.

If these constructions are adopted, it is possible to manufacture the diodes 4 and 5 provided with sufficient avalanche breakdown voltage without adding new manufacturing steps at the time that general CMOS transistor is manufactured.

Figure 9:
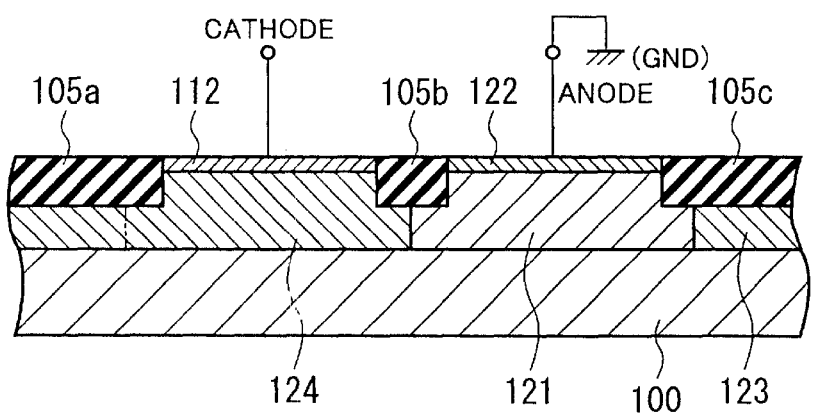
FIG. 9 is a cross sectional view illustrating another embodiment of a structure of a diode 5.

Furthermore, when an epitaxial substrate that is constituted in such a way that an epitaxial film is formed on the p-type silicon substrate is used, it is preferable that structure of the diode 5 may be one illustrated in FIG. 9.

In this case, a p-type silicon epitaxial film 123 whose impurity concentration is, for instance, degree of $1 \times 10^{15}/cm^3$ is deposited on a p-type silicon substrate 101. The p-type silicon epitaxial film 123 is defined by insulating films 105a, 105b and 105c with the STI. An n-type contact region 112 is formed at the surface of a region defined by the insulating films 105a and 105b. Further, the p-type contact region 122 is formed at the surface of the region defined by the insulating films 105b and 105c. The p-type contact region 122 is connected to a wiring. A p-type diffused region 121 is formed just below the p-type contact region 122 so as to be contacted with the p-type contact region 122. The p-type diffused region 121 comes into contact with a p-type region 124, which is just below the n-type contact region 112, under the insulating film 105b. Further, the p-type diffused region 121 has impurity concentration and diffusion depth identical to a p-well for use in general CMOS transistor.

According to such structure, the n-type contact region 112 functions as the cathode, and the p-type region 124 functions as the anode. Then, it is possible to further minimize diffusion capacity of the diode while maintaining avalanche breakdown voltage.

According to these embodiments, size (area) of the first, the second, the third, the fourth and the fifth protection elements is capable of being reduced not more than ⅓ of the area of a prior protection element, for instance, the area of the protection element in the first prior art while maintaining predetermined ESD resist quantity (for instance, concretely, more than 2000V in human body model (HBM), more than 200V in machine model (MM), more than 1000V in charging device model (CDM). Further, parasitic capacitance parasitizing the first signal terminal is suppressed not more than 1 pF. Furthermore, since the MOS transistor is provided between the high potential side power supply and the low potential side power supply as a protection element, it is possible to return to normal operation without breaking power supply after stressof surge by ESD or the like are removed.

The present inventionm is not limited by description of the aforementioned repective embodiments, and it is possible to modify varioysly within limit of the gist. For instance, the third protection device may be constituted from a p-channel MOS transistor whose gate and source (the first terminal) are commonly connected to a V.sub.dd wiring, and whose drain (the second terminal) is connected to a GND wiring.

What is claimed is:

1. A semiconductor device comprising:

a signal terminal;

a high potential side power supply terminal;

a low potential side power supply terminal;

a first wiring connected to said high potential side power supply terminal;

a second wiring connected to said low potential side power supply terminal;

an internal circuit to which power is supplied from said first and said second wirings;

first and second resistance elements whose each one end is connected to a first node, said first node being at a wiring connecting said signal terminal with said internal circuit;

a first protection element having a first terminal connected to said first wiring and a second terminal connected to the other end of said first resistance element, voltage-current characteristics of said first protection element when said second terminal is grounded having a negative resistance region and a holding region;

a second protection element having a third terminal connected to the other end of said second resistance element and a fourth terminal connected to said second wiring, voltage-current characteristics of said second protection element when said fourth terminal is grounded having a negative resistance region and a holding region;

a third protection element having a fifth terminal connected to said first wiring and a sixth terminal connected to said second wiring, said third protection element being made up of a MOS transistor, and voltage-current characteristics of said third protection element when said sixth terminal is grounded having a negative resistance region and a holding region;

a fourth protection element made up of a diode whose anode is connected to a second node and whose cathode is connected to said first wiring, said second node being at said wiring connecting said signal terminal with said internal circuit, and the relations of "$Vh2(I1)+r2\times I1 \geq Vf4+Vr3>Vr2$" and "$Id2>I1$" being satisfied, where I1 represents a value of a first current flowing from said signal terminal to said low potential side power supply terminal via said second resistance element, said second protection element and said second wiring, Id2 represents a value of said first current when it causes destruction of said second protection element, r2 represents a resistance value of said second resistance element, Vf4 represents a voltage when a current starts to flow through said fourth protection element in case that a positive voltage is applied to said anode of said fourth protection element while grounding said cathode of said fourth protection element, Vh2(I1) represents a voltage drop of said second protection element caused by said first current, Vr2 represents a negative resistance starting voltage in said negative resistance region of said second protection element, and Vr3 represents a negative resistance starting voltage in said negative resistance region of said third protection element; and a fifth protection element made up of a diode whose cathode is connected to said second node and whose anode is connected to said second wiring.

2. The semiconductor device according to claim 1, wherein said second node is at a position closer to said signal terminal than said first node.

3. The semiconductor device according to claim 1, wherein said third protection element is made up of an n-channel MOS transistor having a drain as said fifth terminal, a source of said sixth terminal, and a gate connected to said source.

4. The semiconductor device according to claim 1, wherein said first protection element is made up of a p-channel MOS transistor having a source as said first terminal, a drain as said second terminal, and a gate connected to said source, and said second protection element is made up of an n-channel MOS transistor having a drain as said third terminal, a source as said fourth terminal, and a gate connected to said source.

5. The semiconductor device according to claim 1, wherein said anode of said diode is made up of a p-well diffused region, and said cathode of said diode is made up of an n-well diffused region.

6. A semiconductor device comprising:

a signal terminal a high potential side power supply terminal;

a low potential side power supply terminal;

a first wiring connected to said high potential side power supply terminal;

a second wiring connected to said low potential side power supply terminal;

an internal circuit to which power is supplied from said first and said second wirings;

first and second resistance elements whose each one end is connected to a first node, said first node being at a wiring connecting said signal terminal with said internal circuit;

a first protection element having a first terminal connected to said first wiring and a second terminal connected to the other end of said first resistance element, voltage-current characteristics of said first protection element when said second terminal is grounded having a negative resistance region and a holding region;

a second protection element having a third terminal connected to the other end of said second resistance element and a fourth terminal connected to said second wiring, voltage-current characteristics of said second protection element when said fourth terminal is grounded having a negative resistance region and a holding region;

a third protection element having a fifth terminal connected to said first wiring and a sixth terminal connected to said second wiring, said third protection element being made up of a MOS transistor, and voltage-current characteristics of said third protection element when said sixth terminal is grounded having a negative resistance region and a holding region;

a fourth protection element made up of a diode whose anode is connected to a second node and whose cathode is connected to said first wiring, said second node being at said wiring connecting said signal terminal with said internal circuit; and a fifth protection element made up of a diode whose cathode is connected to said second node and whose anode is connected to said second wiring, the relations of "$Vh1(I2)+r1\times I2 \geq Vf5+Vr3>Vr1$" and "$Id1>I2$" being satisfied, where I2 represents a value of a second current flowing from said high potential side power supply terminal to said signal terminal via said first wiring, said first protection element and said first resistance element, Id1 represents a value of said second current when it causes destruction of said first protection element, r1 represents a resistance valve of said first resistance element, Vf5 represents a voltage when a current starts to flow through said fifth protection element in case that a positive voltage is applied to said anode of said fifth protection element while grounding said cathode of said fifth protection element, Vh1(I2) represents a voltage drop of said first protection element caused by said second current, Vr1 represents a negative resistance starting voltage in said negative resistance region of said first protection element, and Vr3 represents a negative resistance starting voltage in said negative resistance region of said third protection element.

7. The semiconductor device according to claim 6, wherein said second node is at a position closer to said signal terminal than said first node.

8. The semiconductor device according to claim 6, wherein said third protection element is made up of an n-channel NOS transistor having a drain as said fifth terminal, a source as said sixth terminal, and a gate connected to said source.

9. The semiconductor device according to claim 6, wherein said first protection element is made up of a p-channel MOS transistor having a source as said first terminal, a drain as said second terminal, and a gate connected to said source, and said second protection element is made up of an n-channel MOS transistor having a drain as said third terminal, a source as said fourth terminal, and a gate connected to said source.

10. The semiconductor device according to claim 6, wherein said anode of said diode is made up of a p-well diffused region, and said cathode of said diode is made up of an n-well diffused region.

* * * * *

UNITED STATES PATENT AND TRADEMARK OFFICE
CERTIFICATE OF CORRECTION

PATENT NO.     : 6,483,365 B2
DATED          : November 19, 2002
INVENTOR(S)    : Morishita It is certified that error appears in the above-identified patent and that said Letters Patent is hereby corrected as shown below:

<u>Column 22,</u>
Line 51, "NOS" should be -- MOS --.

Signed and Sealed this

Twenty-fifth Day of May, 2004

JON W. DUDAS
*Acting Director of the United States Patent and Trademark Office*